US009318556B2

(12) United States Patent
Park et al.

(10) Patent No.: US 9,318,556 B2
(45) Date of Patent: Apr. 19, 2016

(54) GRAPHENE TRANSISTOR HAVING TUNABLE BARRIER

(71) Applicant: Samsung Electronics Co., Ltd., Suwon-Si, Gyeonggi-Do (KR)

(72) Inventors: Jin-hong Park, Suwon-si (KR); Jae-woo Shim, Suwon-si (KR); Hyung-youl Park, Suwon-si (KR); Jae-ho Lee, Seoul (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 0 days.

(21) Appl. No.: 14/328,339

(22) Filed: Jul. 10, 2014

(65) Prior Publication Data

US 2015/0214304 A1 Jul. 30, 2015

(30) Foreign Application Priority Data

Jan. 28, 2014 (KR) .......................... 10-2014-0010721

(51) Int. Cl.
*H01L 29/16* (2006.01)
*H01L 29/78* (2006.01)

(52) U.S. Cl.
CPC ............ *H01L 29/1606* (2013.01); *H01L 29/78* (2013.01)

(58) Field of Classification Search
CPC . H01L 29/78; H01L 29/775; H01L 29/42376; H01L 29/7781; H01L 29/7789; H01L 29/1079; H01L 29/1606
See application file for complete search history.

(56) References Cited

U.S. PATENT DOCUMENTS

| 2010/0258787 | A1* | 10/2010 | Chae | ................... | H01L 29/0673 257/39 |
| 2011/0006837 | A1* | 1/2011 | Wang | ................. | H01L 29/1606 327/539 |
| 2013/0105765 | A1* | 5/2013 | Haensch | ........... | H01L 29/42364 257/29 |

FOREIGN PATENT DOCUMENTS

| JP | 2011-114299 A | 6/2011 |
| KR | 101150270 B1 | 6/2012 |
| KR | 2013-0022854 A | 3/2013 |
| KR | 20130067653 A | 6/2013 |

OTHER PUBLICATIONS

A. Klekachev et al. "Graphene Transistors and Photodetectors" The Electrochemical Society Interface, spring 2013, pp. 63-68.
H. Yang et al. "Graphene Barristor, A Triode Device With a Gate-Controlled Schottky Barrier" Science vol. 336, Jun. 1, 2012, pp. 1140-1143.

* cited by examiner

*Primary Examiner* — Ermias Woldegeorgis
(74) *Attorney, Agent, or Firm* — Harness, Dickey & Pierce

(57) ABSTRACT

Provided are graphene transistors having a tunable barrier. The graphene transistor includes a semiconductor substrate, an insulating thin film disposed on the semiconductor substrate, a graphene layer on the insulating thin film, a first electrode connected to an end of the graphene layer, a second electrode that is separate from an other end of the graphene layer and contacts the semiconductor substrate, a gate insulating layer covering the graphene layer, and a gate electrode on the gate insulating layer, wherein an energy barrier is formed between the semiconductor substrate and the graphene layer.

17 Claims, 4 Drawing Sheets

GRAPHENE TRANSISTOR HAVING TUNABLE BARRIER

RELATED APPLICATIONS

This application claims priority from Korean Patent Application No. 10-2014-0010721, filed on Jan. 28, 2014, in the Korean Intellectual Property Office, the disclosure of which is incorporated herein in its entirety by reference.

BACKGROUND

1. Field

Example embodiments relate to transistors having a tunable semiconductor barrier in which an insulating film is interposed between a graphene layer and a semiconductor.

2. Description of the Related Art

Graphene having a 2-dimensional hexagonal carbon structure is a new material that can replace semiconductor, and studies have been actively conducted on graphene. In particular, graphene is a zero gap semiconductor, and when a graphene nanoribbon (GNR) has a channel width of 10 nm or less, a band gap is formed due to a size effect, and thus, a field effect transistor that can be operated at room temperature can be manufactured.

Recently, a graphene transistor that uses a Schottky barrier that is generated by a junction of graphene and a semiconductor.

However, a graphene transistor typically has a low ON-current and a low OFF-current due to Fermi level pinning that is generated at the junction of the graphene and the semiconductor. Accordingly, an operation voltage of the graphene transistor may increase.

SUMMARY

Example embodiments relate to graphene transistors having a tunable barrier, that is, an insulating thin film is disposed between a graphene layer and a semiconductor.

Additional example embodiments will be set forth in part in the description which follows and, in part, will be apparent from the description, or may be learned by practice of the example embodiments.

According to at least one example embodiment, a graphene transistor having a tunable barrier includes a semiconductor substrate, an insulating thin film disposed on the semiconductor substrate, a graphene layer on the insulating thin film, a first electrode connected to an end of the graphene layer, a second electrode that is separated from an other end of the graphene layer and contacts the semiconductor substrate, a gate insulating layer covering the graphene layer, and a gate electrode on the gate insulating layer, wherein an energy barrier is formed between the semiconductor substrate and the graphene layer.

The insulating thin film may have a thickness in a range of about 1 nm to about 4 nm.

The insulating thin film may include at least one of $Al_2O_3$, $HfO_2$, $TiO_2$, and $Si_3N_4$.

The semiconductor substrate may include one of silicon, germanium, silicon-germanium, a group III-V semiconductor, and a group II-VI semiconductor.

A gap between the graphene layer and the second electrode may be in a range of about 1 nm to about 30 nm.

The graphene transistor may further include an insulating layer between the graphene layer and the insulating thin film at a location corresponding to the first electrode.

The graphene transistor may be a unipolar transistor having a same polarity as the polarity of an impurity of the semiconductor substrate.

The energy barrier may vary according to a gate voltage applied to the gate electrode.

The graphene layer may include between 1 layer and 4 layers of graphene.

According to another example embodiment, a graphene transistor having a tunable barrier includes a back gate substrate, a gate insulating layer on the back gate substrate, a graphene layer on the gate insulating layer, a first electrode formed on a first region of the graphene layer, and a semiconductor layer, an insulating thin film, a second electrode sequentially stacked on a second region of the graphene layer in this order, the second region of the graphene layer being separated from the first region of the graphene layer, and wherein an energy barrier is formed between the semiconductor layer and the graphene layer.

BRIEF DESCRIPTION OF THE DRAWINGS

These and/or other example embodiments will become apparent and more readily appreciated from the following description of the example embodiments, taken in conjunction with the accompanying drawings in which.

DETAILED DESCRIPTION

Figure 1:
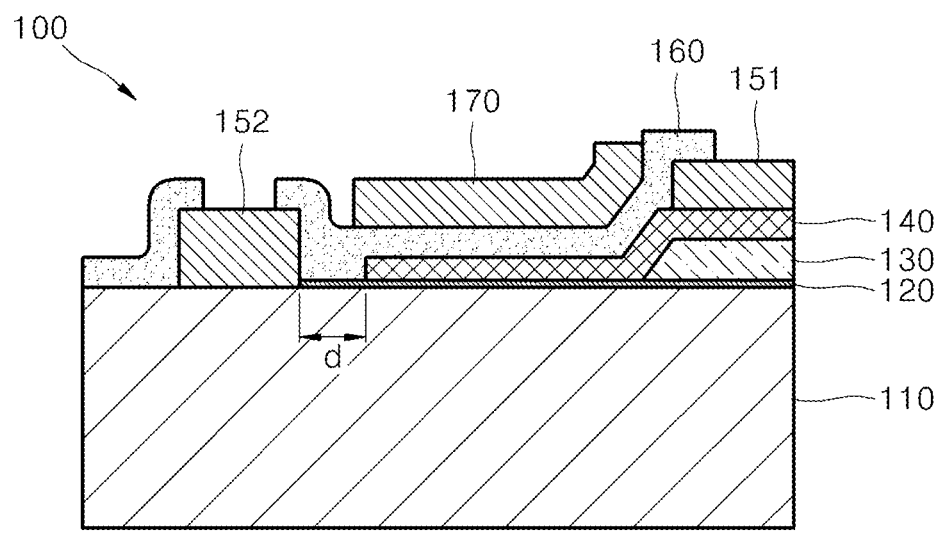
FIG. 1 is a schematic cross-sectional view of a graphene transistor having a tunable barrier according to example embodiments.

Hereinafter, example embodiments will be described more fully with reference to the accompanying drawings. In the drawings, thicknesses of layers and regions may be exaggerated for clarity of the specification. Also, like reference numerals are used for elements that are substantially identical to each other throughout the specification, and the descriptions thereof will not be repeated.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

FIG. 1 is a schematic cross-sectional view of a graphene transistor 100 having a tunable barrier according to example embodiments.

Referring to FIG. 1, an insulating thin film 120 is formed on a substrate 110. An insulating layer 130 is formed on a region of the insulating thin film 120. A graphene layer 140 is formed on the insulating layer 130. The graphene layer 140 extends onto the insulating thin film 120 to directly contact the insulating thin film 120. A first electrode 151 is formed on the graphene layer 140 to face the insulating layer 130. The first electrode 151 is connected to an end of the graphene layer. A second electrode 152 is disposed on the substrate 110 and is separate from the first electrode 151. The second electrode 152 may contact the substrate 110. The second electrode 152 is also separate from an other end of the graphene layer 140. A distance d between the graphene layer 140 and the second electrode 152 may be in a range of about 1 nm to about 30 nm. A gate insulating layer 160 is formed on the substrate 110 and covers at least a portion of the graphene layer 140. A gate electrode 170 is formed on the gate insulating layer 160.

The substrate 110 may be a semiconductor substrate. The semiconductor substrate 110 may be formed of, or include, silicon, germanium, silicon-germanium, a group III-V semiconductor, or a group II-VI semiconductor. The semiconductor substrate 110 may be doped with one of an n-type impurity and a p-type impurity. The semiconductor substrate 110 may face the gate electrode 170 with the graphene layer 140 therebetween.

The insulating thin film 120 may be formed of a material having a band gap that is smaller than the band gap of silicon oxide. For example, the insulating thin film 120 may be formed of, or include, $Al_2O_3$, $HfO_2$, $TiO_2$, or $Si_3N_4$. The insulating thin film 120 may be formed via, for example, a chemical vapor deposition (CVD) method, a thermal evaporation method, an e-beam evaporation method, an atomic layer deposition (ALD) method, or a sputtering method. The insulating thin film 120 may have a thickness in a range from about 1 nm to about 4 nm. When the thickness of the insulating thin film 120 is smaller than 1 nm, holes may be formed in the insulating thin film 120, and at this point, the graphene layer 140 may directly contact the semiconductor substrate 110.

When the thickness of the insulating thin film 120 is greater than 4 nm, a tunneling resistance of the insulating thin film 120 is increased, and accordingly, a current that passes through the insulating thin film 120 may be reduced, which will be described below.

According to at least one example embodiment, the insulating layer 130 prevents the first electrode 151, and the graphene layer 140 under the first electrode 151, from contacting the semiconductor substrate 110. The insulating layer 130 minimizes an effect of a drain voltage on the semiconductor substrate 110. The insulating layer 130 may be optionally omitted. The insulating layer 130 may be formed of the same material used to form the insulating thin film 120, or may be formed of silicon oxide or silicon nitride.

The graphene layer 140 may be formed by transferring and patterning graphene after the graphene is formed by using a CVD method. The graphene layer 140 may include a single layer through 4 layers of graphene. The graphene layer 140 is a pathway for moving carriers, and may have a zero band gap.

The first electrode 151 may be one of a source electrode or a drain electrode and the second electrode 152 may be another of the source electrode or the drain electrode, and may be formed of metal or polysilicon.

The gate insulating layer 160 may be formed of, or include, silicon oxide or silicon nitride.

The graphene transistor 100 having a tunable barrier may be a unipolar transistor, that is, the transistor 100 may be an n-type transistor or a p-type transistor according to the polarity of the semiconductor substrate 110 which is a semiconductor barrier. That is, when the semiconductor substrate 110 is doped with an n-type impurity, the graphene transistor 100 having a tunable barrier is an n-type transistor, and when the semiconductor substrate 110 is doped with a p-type impurity, the graphene transistor 100 having a tunable barrier is a p-type transistor.

Figure 2:
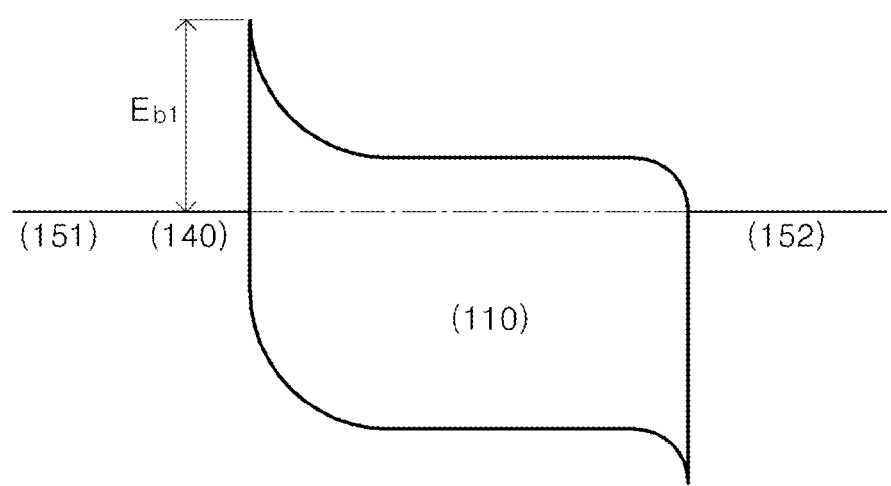
FIG. 2 is an energy band diagram of an n-type graphene transistor without an insulating thin film according to example embodiments.

FIG. 2 is an energy band diagram of an n-type graphene transistor without an insulating thin film 120 of the structure of FIG. 1. Like numerals are used to indicate elements that are substantially identical to elements of FIG. 1.

Referring to FIG. 2, in a state when a gate voltage is not applied to the gate electrode 170, an energy band structure is formed corresponding to respective work functions of the semiconductor substrate 110 and the graphene layer 140. Since the graphene transistor 100 includes the n-type semiconductor substrate 110, the main carriers are electrons. An energy barrier Eb1 is formed between the graphene layer 140 and the semiconductor substrate 110, and the moving of the carriers is restricted by the energy barrier Eb1. The energy barrier Eb1 is relatively large due to a Fermi level pinning phenomenon due to graphene, and accordingly, a driving current of the graphene switching device is reduced.

Figure 3A:
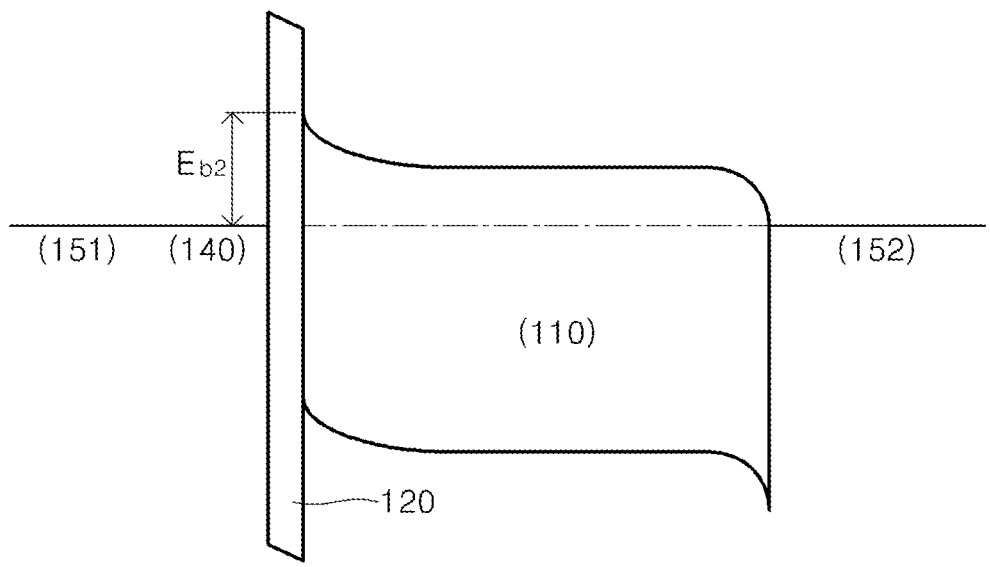
FIGS. 3A and 3B are energy band diagrams for explaining an operation of the n-type graphene transistor of FIG. 1.
Figure 3B:
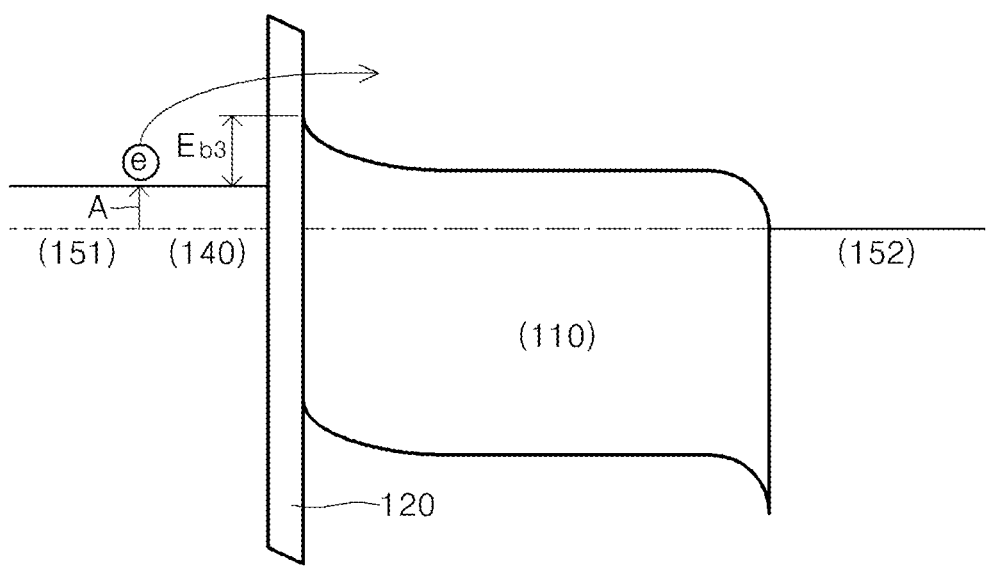

FIGS. 3A and 3B are energy band diagrams for explaining an operation of the n-type graphene transistor 100 of the example embodiment illustrated in FIG. 1.

FIG. 3A shows a band diagram prior to applying a drain voltage and a gate voltage. Due to the insulating thin film 120 in the graphene transistor 100, the Fermi level pinning of the graphene layer 140 does not occur or is substantially reduced. Accordingly, the Fermi level of the graphene layer 140 has an energy barrier Eb2 that is relatively lower than the Fermi level of the energy barrier Eb1 in FIG. 2.

Referring to FIG. 3B, in a state where a predetermined, or alternatively desired positive drain voltage is applied between the first electrode 151 and the second electrode 152, when a predetermined, or alternatively desired positive gate voltage +Vg is applied to the gate electrode 170, the Fermi level of the graphene layer 140 becomes higher in a direction indicated by an arrow A, and as a result an energy barrier Eb3 is further lowered. Accordingly, electrons can move toward the semiconductor substrate 110 by tunneling through the insulating thin film 120. This denotes that a current flows in the graphene transistor 100 by application of the gate voltage +Vg, and accordingly, the graphene transistor 100 performs as a field effect transistor. The graphene layer 140 is a pathway of carriers, and is distinguished from a channel of a conventional field effect transistor.

A driving current is increased due to the insulating thin film 120, and accordingly, the driving voltage of the graphene transistor 100 is reduced.

As the gate voltage +Vg increases, the energy barrier Eb3 of the semiconductor substrate 110 is further lowered. Accordingly, the energy barrier of the graphene transistor 100 may be tunable. Also, the graphene transistor 100 is referred to as a graphene transistor having a tunable barrier.

When a negative drain voltage is applied between the first electrode 151 and the second electrode 152, a drain current is increased as the Fermi level of the semiconductor substrate 110 becomes high, and when a positive drain voltage is applied between the first electrode 151 and the second electrode 152, the drain current is lowered by lowering the Fermi level of the semiconductor substrate 110. Accordingly, the graphene transistor 100 may have a diode characteristic.

Figure 4:
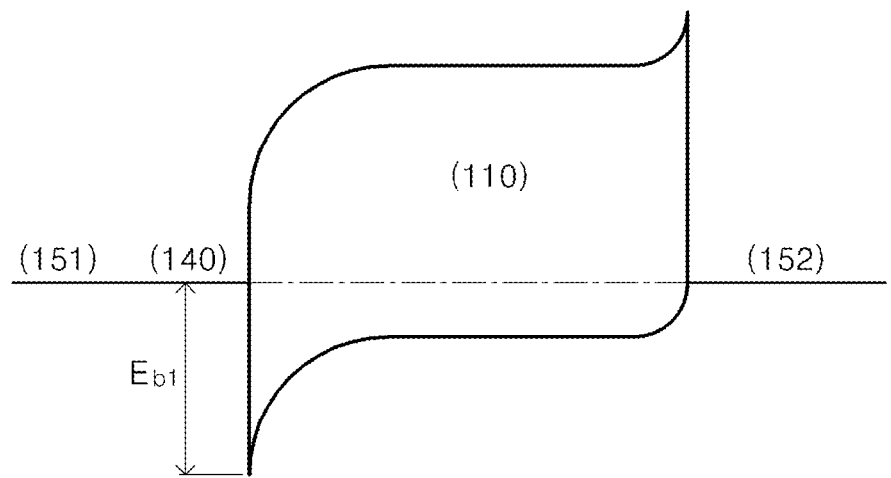
FIG. 4 is an energy band diagram of a p-type graphene transistor without an insulating thin film according to example embodiments.

FIG. 4 is an energy band diagram of a p-type graphene transistor without an insulating thin film. Like numerals are used to indicate elements that are substantially identical to elements of FIG. 1.

Referring to FIG. 4, in a state when a gate voltage is not applied to the gate electrode 170, an energy band structure corresponding to each work function of the semiconductor substrate 110 and the graphene layer 140 is formed. The graphene transistor includes a p-type semiconductor substrate 110, thus, the main carriers are holes. An energy barrier Eb1 is formed between the graphene layer 140 and the semiconductor substrate 110. Movement of the carriers is restricted by the energy barrier Eb1. The energy barrier Eb1 is relatively large due to a Fermi level pinning phenomenon, and accordingly, a driving current of a graphene switching device is reduced.

Figure 5A:
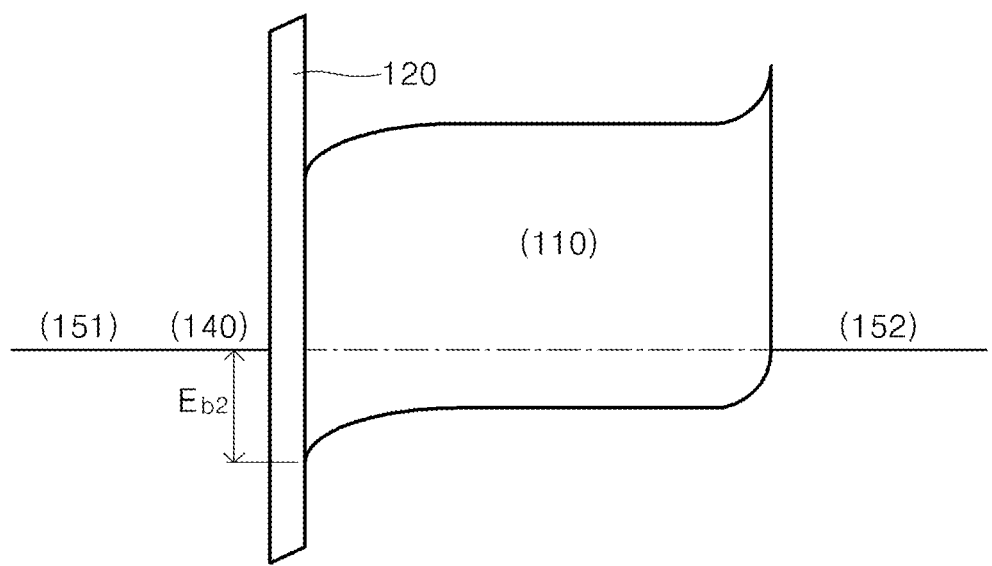
FIGS. 5A and 5B are energy band diagrams for explaining an operation of the p-type graphene transistor of FIG. 1.
Figure 5B:
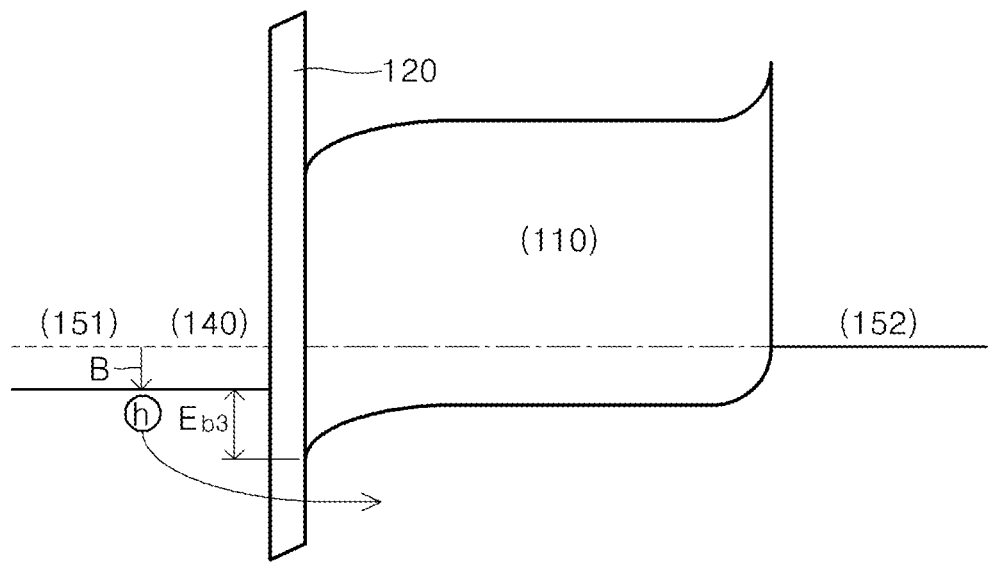

FIGS. 5A and 5B are energy band diagrams for explaining an operation of the p-type graphene transistor 100 of the example embodiment illustrated in FIG. 1.

FIG. 5A shows a band diagram prior to applying a drain voltage and a gate voltage. Due to the insulating thin film 120, the Fermi level pinning phenomenon does not occur. Accordingly, the graphene transistor 100 has a relatively low energy barrier Eb2.

Referring to FIG. 5B, in a state when a predetermined, or alternatively desired negative drain voltage is applied between the first electrode 151 and the second electrode 152, when a predetermined, or alternatively desired negative gate voltage −Vg is applied to the gate electrode 170, the Fermi level of the graphene layer 140 is lowered in a direction as indicated by arrow B and the energy barrier Eb3 is further lowered, and thus, holes can move towards the semiconductor substrate 110 by tunneling through the insulating thin film 120. This denotes that a current flows in the graphene transistor 100 by the gate voltage, and accordingly, the graphene transistor 100 operates as a field effect transistor. The graphene layer 140 is a pathway of the carriers, and is distinguished from a channel of a conventional field effect transistor.

Also, a driving current is increased due to the insulating thin film 120, and accordingly, the driving voltage of the graphene transistor 100 is reduced.

As the gate voltage increases, the energy barrier Eb3 of the semiconductor substrate 110 is further reduced. Accordingly, the energy barrier Eb3 of the graphene transistor 100 may be tunable.

When a negative drain voltage is applied, a drain current is lowered while the Fermi level of the semiconductor substrate 110 becomes high. When a positive drain voltage is applied, the drain current increases while the Fermi level of the semiconductor substrate 110 is lowered. Accordingly, the graphene transistor 100 may have a diode characteristic.

Figure 6:
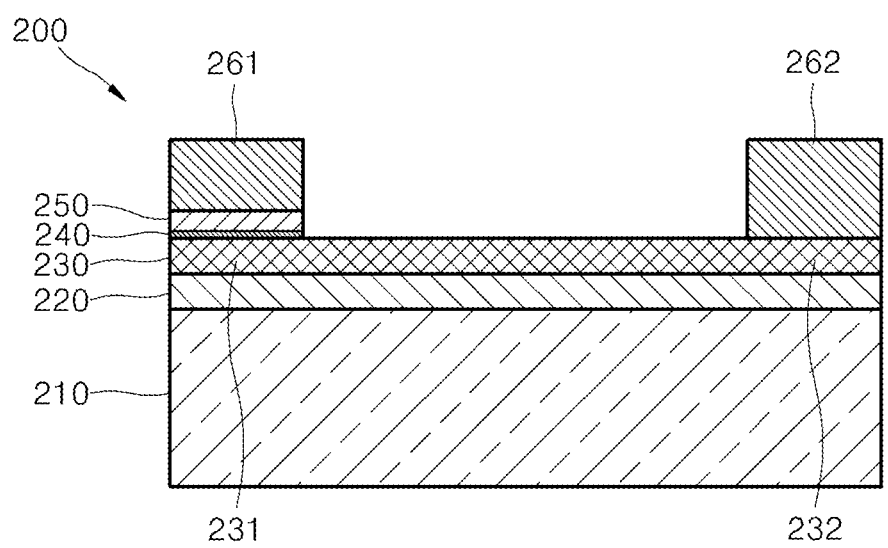
FIG. 6 is a schematic cross-sectional view of a graphene transistor having a tunable barrier according to example embodiments.

FIG. 6 is a schematic cross-sectional view of a graphene transistor 200 having a tunable barrier according to example embodiments.

Referring to FIG. 6, a gate insulating layer 220 is formed on a substrate 210. A graphene layer 230 is formed on the gate insulating layer 220. An insulating thin film 240, a semiconductor layer 250, and a first electrode 261 are sequentially formed on a first region 231 of the graphene layer 230. A second electrode 262 is formed on a second region 232 of the graphene layer 230, the second electrode 262 being separate from the first region 231 of the graphene layer 230.

The first electrode 261 is one of a source electrode and a drain electrode, and the second electrode 262 is another of the source electrode and the drain electrode. The first electrode 261 and the second electrode 262 may be formed of, or include, metal or polysilicon.

The substrate 210 is configured to operate as a back gate, and may be formed of a semiconductor doped with an impurity or a metal.

The gate insulating layer 220 may be formed of, or include, silicon oxide or silicon nitride.

The graphene layer 230 may be formed by patterning graphene after transferring the graphene manufactured by using, for example, a CVD method. The graphene layer 230 may include 1 layer through 4 layers of graphene. The graphene layer 230 may be a pathway of carriers and may have a zero band gap.

The insulating thin film 240 may be formed of a material having a band gap smaller than the band gap of silicon oxide. For example, the insulating thin film may be formed of, or include, $Al_2O_3$, $HfO_2$, $TiO_2$, $Si_3N_4$, and the like. The insulating thin film 240 may be formed by using a CVD method, an e-beam evaporator, an ALD method, or a sputtering method. The insulating thin film 240 may have a thickness in a range of about 1 nm to about 4 nm. When the insulating thin film 240 has a thickness smaller than 1 nm, holes may be formed in the insulating thin film 240, and thus, the graphene layer 230 may directly contact the semiconductor layer 250.

When the insulating thin film 240 has a thickness greater than 4 nm, a tunneling resistance of the insulating thin film 240 may be increased, and accordingly, a current tunneling through the insulating thin film 240 may be reduced.

The semiconductor layer 250 may be formed of, or include, silicon, germanium, silicon-germanium, a group III-V semiconductor, or a group II-VI semiconductor. The semiconductor layer 250 may have a thickness through which tunneling of carriers is possible. The thickness of the semiconductor layer 250 may vary according to materials of the semiconductor layer 250, and may have a thickness in a range of about 1 nm to about 10 nm. The semiconductor layer 250 is doped with one of an n-type impurity or a p-type impurity.

The graphene transistor 200 having a tunable barrier may be a unipolar transistor, that is, may be an n-type transistor or a p-type transistor according to the polarity of the semiconductor layer 250. Accordingly, when the semiconductor layer 250 is doped with an n-type impurity, the graphene transistor 200 having a tunable barrier is an n-type transistor, and when the semiconductor layer 250 is doped with a p-type impurity, the graphene transistor 200 having a tunable barrier is a p-type transistor.

Operation of the graphene transistor 200 having a tunable barrier may be well understood from the operation of the graphene transistor 100, and thus, a detailed description thereof will be omitted.

As described above, according to example embodiments, a graphene transistor having a tunable barrier prevents or reduces a pinning phenomenon of graphene by disposing an insulating thin film between a graphene and a semiconductor, and thus, a height of an energy barrier between the graphene and the semiconductor is reduced. Thus, a driving voltage of the graphene transistor can be reduced.

While one or more example embodiments have been described with reference to the figures, it will be understood by those of ordinary skill in the art that various changes in form and details may be made therein without departing from the spirit and scope defined by the following claims.

What is claimed is:

1. A graphene transistor having a tunable barrier comprising:
    a semiconductor substrate;
    an insulating thin film on the semiconductor substrate;
    a graphene layer on the insulating thin film;
    a first electrode connected to an end of the graphene layer;
    a second electrode, separate from an other end of the graphene layer, directly contacting the semiconductor substrate;
    a gate insulating layer covering at least a portion of the graphene layer; and
    a gate electrode on the gate insulating layer, and
    an insulating layer between the graphene layer and the insulating thin film at a location corresponding to the first electrode;
    wherein an energy barrier is between the semiconductor substrate and the graphene layer.

2. The graphene transistor of claim 1, wherein the insulating thin film has a thickness in a range of about 1 nm to about 4 nm.

3. The graphene transistor of claim 1, wherein the insulating thin film includes at least one of Al2O3, HfO2, TiO2, and Si3N4.

4. The graphene transistor of claim 1, wherein the semiconductor substrate includes at least one of silicon, germanium, silicon-germanium, a group III-V semiconductor, and a group II-VI semiconductor.

5. The graphene transistor of claim 1, wherein a distance between the graphene layer and the second electrode is in a range of about 1 nm to about 30 nm.

6. The graphene transistor of claim 1, wherein the graphene transistor is a unipolar transistor having a same polarity as a polarity of an impurity of the semiconductor substrate.

7. The graphene transistor of claim 1, wherein the energy barrier varies according to a gate voltage applied to the gate electrode.

8. The graphene transistor of claim 1, wherein the graphene layer includes between 1 layer and 4 layers of graphene.

9. A graphene transistor having a tunable barrier comprising:
    a back gate substrate;
    a gate insulating layer on the back gate substrate;
    a graphene layer on the gate insulating layer;
    a first electrode on a first region of the graphene layer; and
    a semiconductor layer, an insulating thin film and a second electrode stacked on a second region of the graphene layer, the second region of the graphene layer being distinct from the first region of the graphene layer;
    wherein an energy barrier is between the semiconductor layer and the graphene layer.

10. The graphene transistor of claim 1, wherein the graphene layer is separate from the second electrode.

11. The graphene transistor of claim 9, wherein the insulating thin film has a thickness in a range of about 1 nm to about 4 nm.

12. The graphene transistor of claim 9, wherein the insulating thin film includes at least one of Al2O3, HfO2, TiO2, and Si3N4.

13. The graphene transistor of claim 9, wherein the semiconductor layer includes at least one of silicon, germanium, silicon-germanium, a group III-V semiconductor, and a group II-VI semiconductor.

14. The graphene transistor of claim 9, wherein the semiconductor layer has a thickness in a range of about 1 nm to about 10 nm.

15. The graphene transistor of claim 9, wherein the graphene transistor is a unipolar transistor having a same polarity as a polarity of an impurity of the semiconductor layer.

16. The graphene transistor of claim 9, wherein the energy barrier varies according to a gate voltage applied to the gate electrode.

17. The graphene transistor of claim 9, wherein the graphene layer includes between 1 layer and 4 layers of graphene.

* * * * *